(12) United States Patent
Matsumoto et al.

(10) Patent No.: US 11,984,702 B2
(45) Date of Patent: May 14, 2024

(54) OPTICAL SCANNING DEVICE, IMAGE-FORMING APPARATUS, AND CONTROL METHOD

(71) Applicant: SHARP KABUSHIKI KAISHA, Sakai (JP)

(72) Inventors: Kazutaka Matsumoto, Sakai (JP); Hiroyuki Asoda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 277 days.

(21) Appl. No.: 17/562,339

(22) Filed: Dec. 27, 2021

(65) Prior Publication Data

US 2022/0216671 A1 Jul. 7, 2022

(30) Foreign Application Priority Data

Jan. 7, 2021 (JP) .................................. 2021-001574
Jan. 13, 2021 (JP) .................................. 2021-003649

(51) Int. Cl.
| | |
|---|---|
| H01S 5/042 | (2006.01) |
| B41J 2/44 | (2006.01) |
| B41J 2/47 | (2006.01) |
| G03G 15/04 | (2006.01) |
| H01S 5/00 | (2006.01) |
| H01S 5/06 | (2006.01) |
| H01S 5/0683 | (2006.01) |

(52) U.S. Cl.
CPC ............ *H01S 5/0427* (2013.01); *B41J 2/442* (2013.01); *B41J 2/471* (2013.01); *H01S 5/0071* (2013.01); *H01S 5/0617* (2013.01); *H01S 5/0683* (2013.01); *G03G 15/04* (2013.01)

(58) Field of Classification Search
CPC ..... G03G 2215/0404; G03G 15/04072; G03G 15/043; G03G 15/80; B41J 2/442; B41J 2/471; H01S 5/06804; G06K 15/1209; G11B 7/00; G11B 7/09

See application file for complete search history.

(56) References Cited

U.S. PATENT DOCUMENTS

| | | | |
|---|---|---|---|
| 2006/0017795 A1* | 1/2006 | Nomura .................. | H04N 1/113 347/232 |
| 2007/0285491 A1* | 12/2007 | Kishimoto ......... | G06K 15/1209 347/233 |
| 2011/0043594 A1* | 2/2011 | Yamashita ............... | B41J 2/473 347/246 |

(Continued)

FOREIGN PATENT DOCUMENTS

| | | |
|---|---|---|
| JP | 2003-298178 A | 10/2003 |
| JP | 2018-069518 A | 5/2018 |

*Primary Examiner* — John Zimmermann
(74) *Attorney, Agent, or Firm* — ScienBiziP, P.C.

(57) ABSTRACT

An optical scanning device includes a laser light emitter in which an excess of a current over a bias current is increased or decreased in proportion to an analog signal input thereto, a laser driver to drive the laser light emitter, an optical scanner to scan a surface of an object with laser light emitted from the laser light emitter, an offset value determiner to determine an offset value of the analog signal input to the laser light emitter based on a target light quantity of the laser light emitter, and a laser driver controller to control a quantity of light emitted from the laser light emitter by inputting a signal on the basis of a signal of the determined offset value to the laser driver.

10 Claims, 15 Drawing Sheets

(56) References Cited

U.S. PATENT DOCUMENTS

2014/0086611 A1* 3/2014 Nakagawa ........ H02M 3/33507
363/21.02
2021/0103229 A1* 4/2021 Matsumoto .......... G03G 15/043

* cited by examiner

FIG. 4

| Vref (dec) | Voffset (dec) |
|---:|---:|
| 0 | 192 |
| 1 | 192 |
| : | : |
| 20 | 191 |
| : | : |
| 128 | 64 |
| : | : |
| 160 | 33 |
| : | : |
| 255 | 32 |

FIG. 9A

WHEN TEMPERATURE IS
5 TO 15°C

| Vref (dec) | Voffset (dec) |
|---:|---:|
| 0 | 128 |
| 1 | 128 |
| : | : |
| 20 | 127 |
| : | : |
| 128 | 32 |
| : | : |
| 160 | 1 |
| : | : |
| 255 | 0 |

FIG. 9B

WHEN TEMPERATURE IS
15 TO 30°C

| Vref (dec) | Voffset (dec) |
|---:|---:|
| 0 | 192 |
| 1 | 192 |
| : | : |
| 20 | 191 |
| : | : |
| 128 | 64 |
| : | : |
| 160 | 33 |
| : | : |
| 255 | 32 |

FIG. 9C

WHEN TEMPERATURE IS
30 TO 45°C

| Vref (dec) | Voffset (dec) |
|---:|---:|
| 0 | 255 |
| 1 | 255 |
| : | : |
| 20 | 254 |
| : | : |
| 128 | 92 |
| : | : |
| 160 | 65 |
| : | : |
| 255 | 64 |

OPTICAL SCANNING DEVICE, IMAGE-FORMING APPARATUS, AND CONTROL METHOD

BACKGROUND OF THE INVENTION

Field of the Invention

The present disclosure relates to an optical scanning device and the like.

Description of the Background Art

In an image-forming apparatus, an exposure process is performed to form an electrostatic latent image on the surface of a photoreceptor drum during a process of forming an image based on an image signal on a recording paper (a sheet-like image recording medium). An optical scanning device, which scans the photoreceptor drum as an object to be scanned with a laser beam emitted from a laser diode (light emitting device), is installed for the exposure process.

Generally, a laser diode has a characteristic that an optical output rises at the threshold current as an input current is increased. Conventionally, a bias current flows through the laser diode continuously in order to reduce delay at a rising time to shorten the rising time of a laser oscillation.

Regarding the bias current, it has been proposed to address the issue of the bias current. An example of disclosures is a light emitting device driving device using an auto-bias circuit method in which automatically adjusts the bias current according to changes in the threshold current in order to follow changes in the threshold current caused by temperature changes and changes over time without fixing the bias current. (see Japanese Patent Laid-open Publication No. 2003-298178).

On the other hand, another proposal has been made that is a technology regarding a laser driver in which the excess of a current over the fixed bias current is increased or decreased in proportion to an analog signal without the auto-bias circuit as disclosed in Patent Laid-open Publication No. 2003-298178.

Regarding the fixed bias current, as another approach, Japanese Patent Laid-open Publication No. 2018-69518 discloses an optical scanning device that corrects a quantity of light emitted from a light source by using an optical drive unit having no auto-bias control function.

Japanese Patent Laid-open Publication No. 2018-69518 discloses calculating a voltage value of an analog signal to control a laser driver according to a target light quantity, after storing a characteristic between a light quantity and a current of a laser diode (i.e., P-I characteristic) for each temperature. However, such a scheme disclosed in Japanese Patent Laid-open Publication No. 2018-69518 had the following problems.

It was necessary to calculate repeatedly the voltage value of the analog signal responding to changes in the target light quantity due to an environmental correction, a life time (usage time) correction or the like, and thus a long time was required for the process.

While a shading was carried out at a low target light quantity level, resolution of the shading was degraded.

When the laser diodes had a variation in the P-I characteristic and an original light quantity individually, deviation caused in the target light quantity.

In order to solve the above mentioned problems, although it can be considered to make an offset control on the shading correction value, an operating point of the laser may move and thus it may become difficult to control the laser intensity to the target light quantity when a change in the signal for making the offset control on the shading is relatively large.

In light of the aforementioned circumstances, the present disclosure provides an optical scanning device and the like in which a long time is not required for a process according to changes in the target light quantity, resolution is maintained while the shading is performed, and any deviation does not cause in the target light quantity.

SUMMARY OF THE INVENTION

The present disclosure relates to an optical scanning device including: a laser light emitter in which an excess of a current over a bias current is increased or decreased in proportion to an analog signal input thereto; a laser driver to drive the laser light emitter; an optical scanner to scan a surface of an object with laser light emitted from the laser light emitter; an offset value determiner to determine an offset value of the analog signal input to the laser light emitter based on a target light quantity of the laser light emitter; and a laser driver controller to control a quantity of light emitted from the laser light emitter by inputting a signal on the basis of a signal of the determined offset value to the laser driver.

Furthermore, the present disclosure relates to an image-forming apparatus including: a laser light emitter in which an excess of a current over a bias current is increased or decreased in proportion to an analog signal input thereto; a laser driver to drive the laser light emitter; an optical scanner to scan a surface of an object with laser light emitted from the laser light emitter; an offset value determiner to determine an offset value of the analog signal input to the laser light emitter based on a target light quantity of the laser light emitter; a laser driver controller to control a quantity of light emitted from the laser light emitter by inputting a signal on the basis of a signal of the determined offset value to the laser driver; an image carrier, on the surface of which an electrostatic latent image is formed by scanning the surface with the laser light emitted from the laser light emitter, using the optical scanner; and a developer to develop the electrostatic latent image formed on the surface of the image carrier.

Furthermore, the present disclosure relates to a method of controlling an optical scanning device including a laser light emitter in which an excess of a current over a bias current is increased or decreased in proportion to an analog signal input thereto, a laser driver to drive the laser light emitter, and an optical scanner to scan a surface of an object with laser light emitted from the laser light emitter, the method comprising the steps of: determining an offset value of the analog signal input to the laser light emitter based on a target light quantity of the laser light emitter; and controlling a quantity of light emitted from the laser light emitter by inputting a signal on the basis of a signal of the determined offset value to the laser driver.

According to the optical scanning device or the like of the present disclosure, since the quantity of light emitted from the laser light emitter is controlled by superimposing the signal of the determined offset value on the analog signal to offset the analog signal, and inputting the offset analog signal to the laser driver, it results in remarkable effects that a long time is not required for the process according to changes in the target light quantity, the resolution is maintained while the shading processing is performed, and no deviation can be in the target light quantity.

Furthermore, according to the optical scanning device or the like of the present disclosure, since it is provided with a phase delay compensator to compensate for a phase delay of the signal of the offset value determined by the offset value determiner, a superimposer to superimpose a signal of the phase-delay-compensated offset value on a signal of a shading correction value, and a laser driver controller to control the quantity of light emitted from the laser light emitter by inputting the signal superimposed by the superimposer to the laser driver, it results in remarkable effects that a long time is not required for the process according to changes in the target light quantity, the resolution is maintained while the shading processing is performed, and any deviation in the target light quantity can be prevented.

BRIEF DESCRIPTION OF THE DRAWINGS

FIG. 4 is an explanatory diagram of an example of an offset adjusting table.

FIGS. 9A to 9C respectively illustrate examples of the offset adjusting table for each temperature range.

DESCRIPTION OF THE PREFERRED EMBODIMENTS

Now, an embodiment for carrying out the present disclosure is described below with reference to the drawings.

Meanwhile, the following embodiments are examples for describing the present disclosure, and thus the technical scope of the invention stated in the claims is not limited to the following description.

1. First Embodiment

First, a configuration of an image-forming apparatus 10 according to the first embodiment is described.

1.1 Overall Configuration

Figure 1:
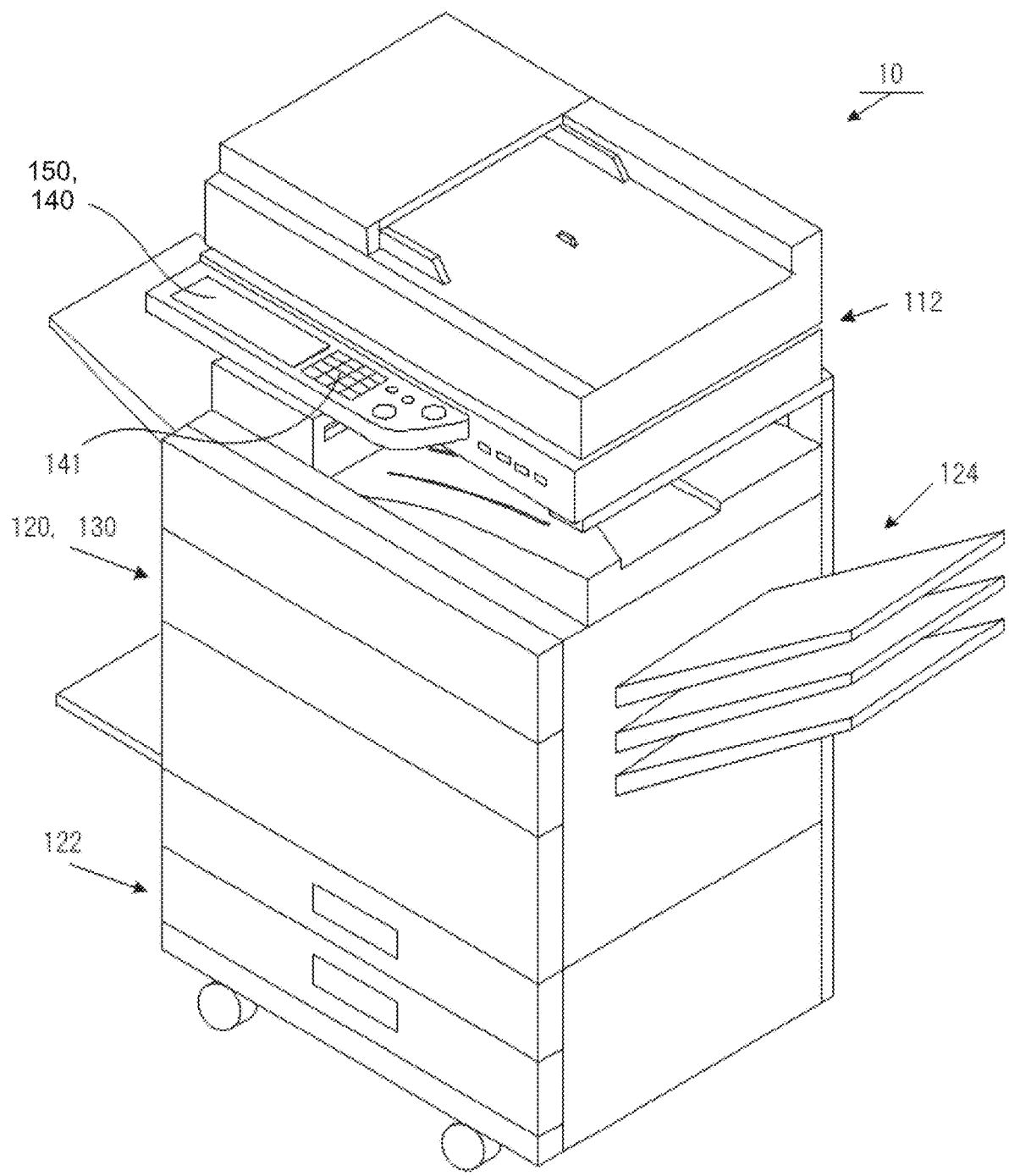
FIG. 1 is a perspective view of an image-forming apparatus equipped with an optical scanning device according to a first embodiment.

As shown in FIG. 1, the image-forming apparatus 10 is an information processing apparatus which includes a document reader 112 on the upper side of the image-forming apparatus 10 to read an image of a document and outputs the image using an electrophotographic method. An example of an image-forming apparatus 10 can include a multifunction printer.

Figure 2:
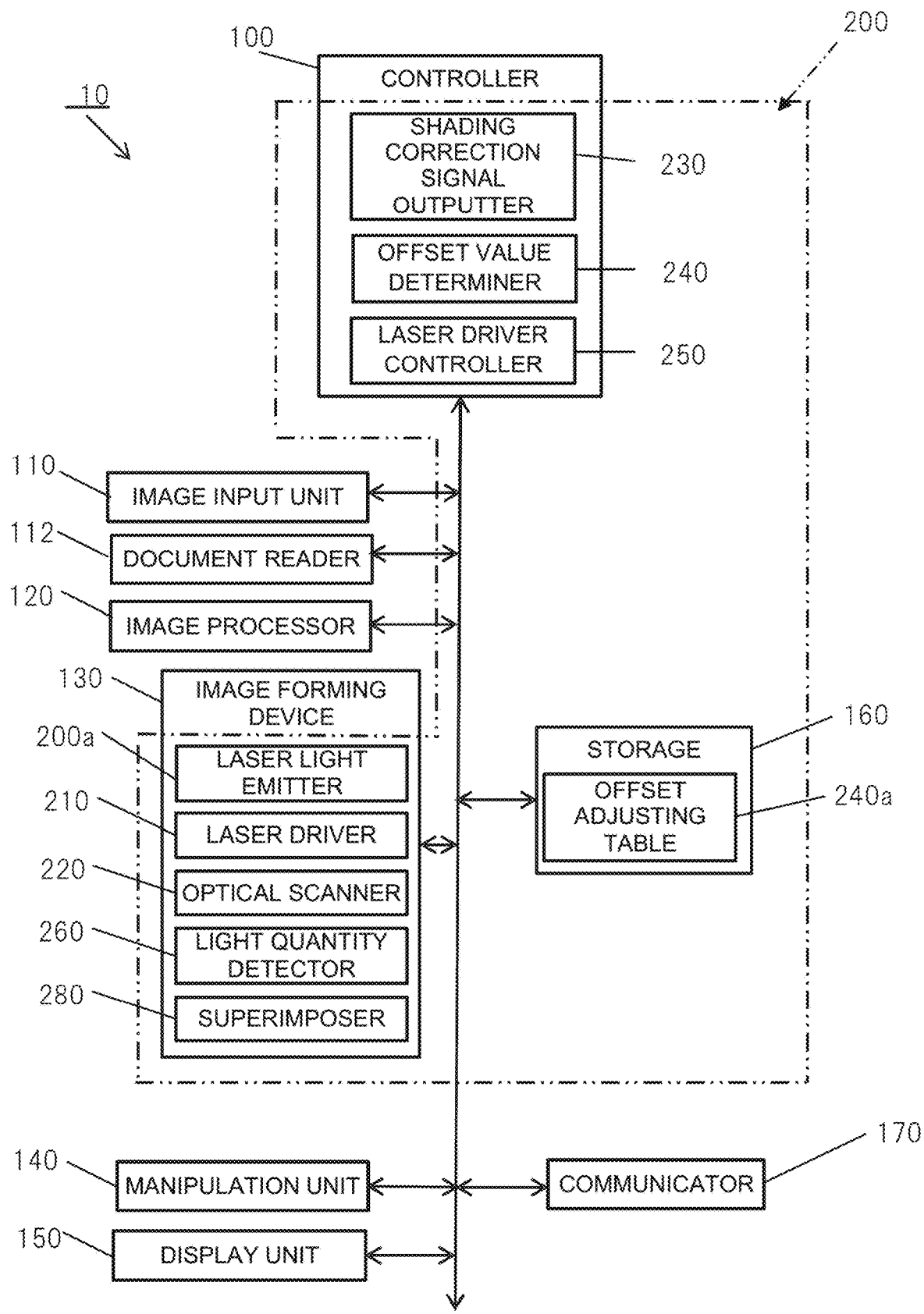
FIG. 2 is a block diagram of the image-forming apparatus and the optical scanning device.

As shown in FIG. 2 illustrating a control system diagram, the image-forming apparatus 10 mainly includes a controller 100, an image input unit 110, the document reader 112, an image processor 120, an image forming unit 130, a manipulation unit 140, a display unit 150, a storage 160, and a communication unit 170, as well as a function of an optical scanning device 200.

1.2 Functional Configuration

The controller 100 is a functional part for controlling the entire image-forming apparatus 10.

The controller 100 realizes various functions by reading and executing various programs, and is composed of one or more arithmetic devices (e.g., a CPU (Central Processing Unit)) and the like, for example.

The image input unit 110 is a functional part for reading image data input to the image-forming apparatus 10. In addition, the image input unit 110 is connected to the document reader 112 which is a functional part for reading an image of a document, and inputs the image data output from the document reader 112.

The image input unit 110 may also input the image data from a storage medium such as a USB memory, an SD card, or the like. The image data may also be input from other terminal devices by the communication unit 170 connected to other terminal devices.

The document reader 112 has a function of optically reading a document placed on a contact glass (not shown) and passing the scanned data to the image processor 120.

The image forming unit 130 is a functional unit for forming output data based on image data on a recording medium (e.g., recording paper). For example, as shown in FIG. 1, a recording paper is fed from a paper feeding tray 122, and after an image is formed on the surface of the recording paper in the image forming unit 130, the recording paper is discharged to a paper discharging tray 124. The image forming unit 130 is configured of a laser printer employing an electrophotographic process using an electrophotographic method.

The electrophotographic process of the image forming unit 130 includes: scanning a laser beam (corresponding to a laser light) corresponding to the image data on the surface of a photoreceptor drum (image carrier) 130a (see FIG. 5) by the optical scanning device 200 described below to form an electrostatic latent image, developing the electrostatic latent image with toner, and transferring and fixing the developed toner image onto a recording medium to form an image.

The image processor 120 has a function to convert the image data into a set file format (e.g. TIFF, GIF, JPEG, etc.) based on the image data read by the document reader 112. The output image is then formed based on the image data in which an image data processing has been performed.

The manipulation unit 140 is a functional unit for receiving operation instructions by a user, and is composed of various key switches, a device for detecting input by a touch, and the like. The user can input functions to be used or output conditions via the manipulation unit 140.

The display unit 150 is a functional unit for displaying various information to the user, and is composed of an LCD (liquid crystal display) or the like, for example.

Namely, the manipulation unit 140 provides a user interface for operating the image-forming apparatus 10, and the display unit 150 displays various setting menu screens and messages of the image-forming apparatus.

As shown in FIG. 1, the image-forming apparatus 10 may include a touch panel as the manipulation unit 140 in which an operation panel 141 and the display unit 150 are integrally arranged. In such a case, an input detecting method of the touch panel may be a general detection method, such as a resistive film method, an infrared method, an electromagnetic induction method, a capacitance method, etc.

The storage 160 is a functional unit for storing various programs including a control program necessary for the operation of the image-forming apparatus 10, various data including reading data, or user information. The storage 160 is composed of a non-volatile ROM (Read Only Memory), RAM (Random Access Memory), HDD (Hard Disk Drive), and the like, for example. It may also include a Solid State Drive (SSD) which is a semiconductor memory.

The communication unit 170 can communicate with an external device. A communication interface (communication I/F) is provided to send and receive data as the communication unit 170. According to the user's manipulation at the image-forming apparatus 10, the communication I/F allows data stored in the storage of the image-forming apparatus 10 to be sent to and received from any other computer device connected via a network.

1.3 Optical Scanning Device 200

As shown in FIG. 2, the optical scanning device 200 is mounted on the image-forming apparatus 10.

Figure 3A:
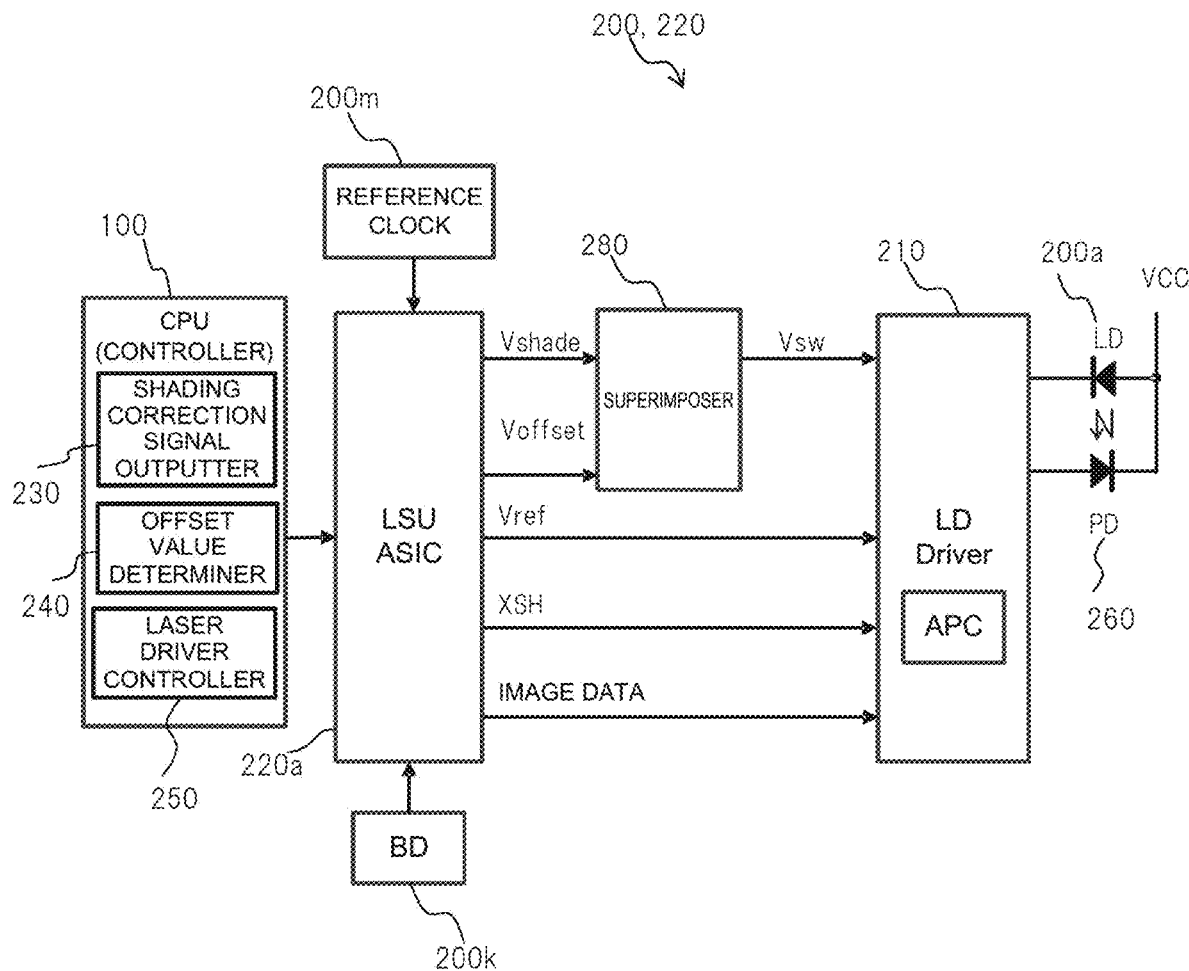
FIGS. 3A and 3B are a block diagram illustrating a control system of a laser driver in the optical scanning device and a circuit diagram of a signal transmission path of a laser light emitter and the laser driver in the optical scanning device, respectively.
Figure 3B:
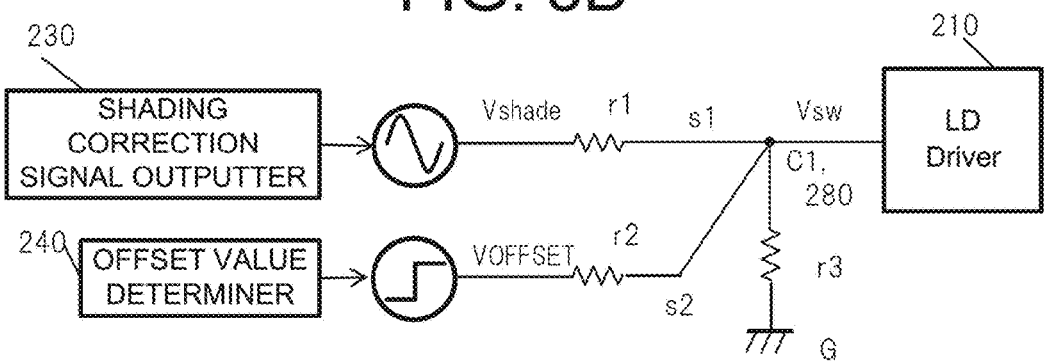
Figure 5:
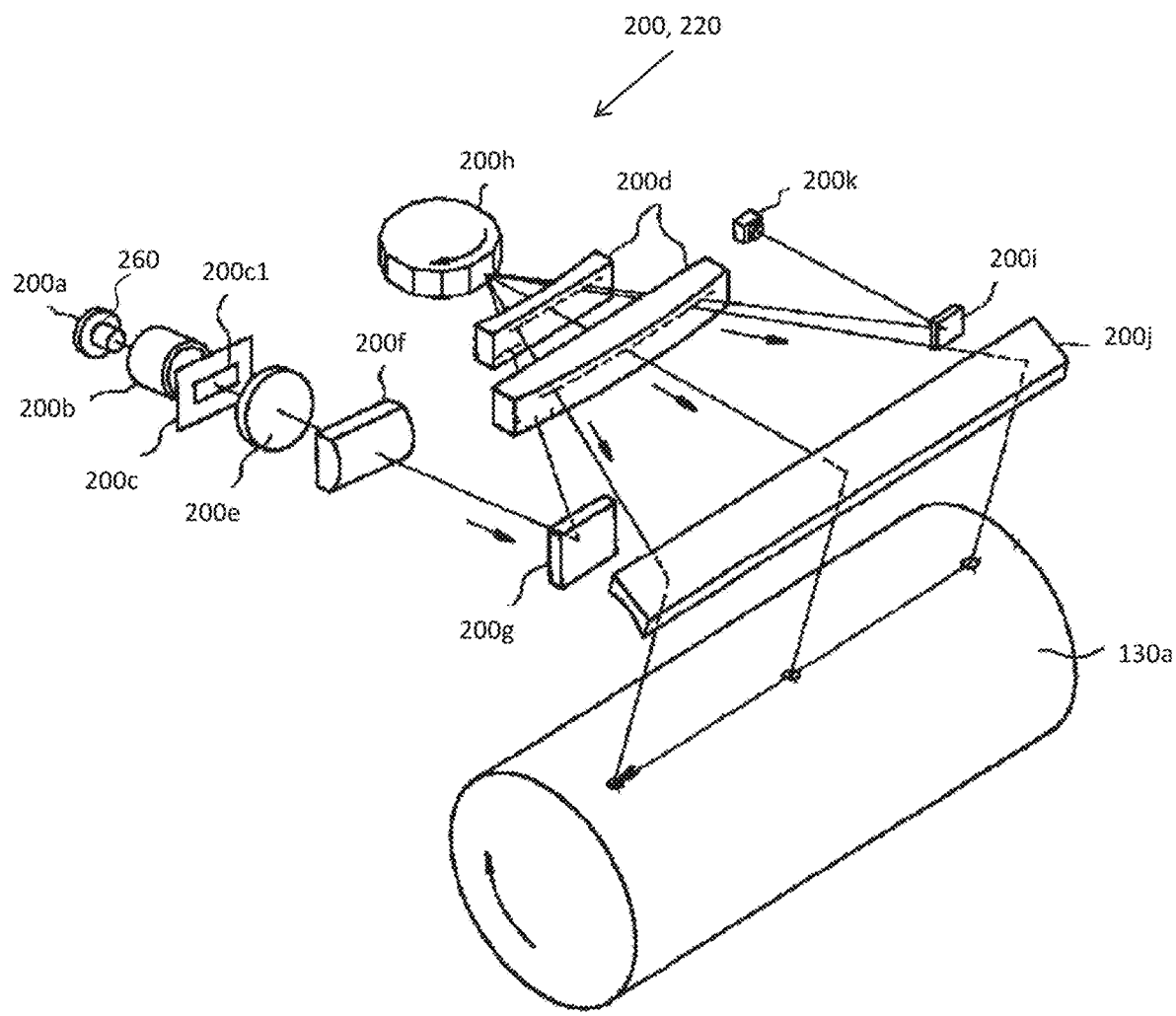
FIG. 5 is an explanatory diagram of a mechanical configuration of an optical scanner.

FIG. 3A shows a block diagram of a control system of a laser driver in the optical scanning device 200, and FIG. 3B shows a specific circuit diagram of a signal transmission path around the laser driver in the optical scanning device 200. FIG. 5 shows a mechanical configuration of the optical scanning device 200.

As shown in FIGS. 2 and 3A, the optical scanning device 200 includes: a laser light emitter (LD: Laser Device) 200a in which the excess of a current over a bias current is increased or decreased in proportion to an input analog signal; a laser driver 210 to drive the laser light emitter; an optical scanner 220 to scan the photoreceptor drum 130a being an object with a laser beam (laser light) output from the laser light emitter 200a; a shading correction signal outputter 230 to output a shading correction value signal (Vshade) for making a shading correction on a light scanning the object; an offset value determiner 240 to determine an offset value of the analog signal input to the laser light emitter 200a based on a target light quantity (Vref) of the laser light emitter 200a; a superimposer (superimposing circuit) 280 to superimpose the determined offset value signal (Voffset) on the analog signal (shading correction value signal (Vshade)) and offset it; and a laser driver controller 250 to control quantity of light emitted from the laser light emitter (LD) 200a by inputting an offset analog signal shading correction signal (Vsw) to the laser driver (LD Driver) 210.

In the optical scanning device 200, the control system of the optical scanner 220 may have a laser scanning unit 220a shown in FIG. 3A. The laser scanning unit 220a inputs signals output from the shading correction signal outputter 230 and the offset value determiner 240 to the laser driver 210 in response to a control signal from the controller 100. The laser scanning unit 220a is composed of an application-specific integrated circuit (LSUASIC), for example. A reference clock signal 200m and a detection signal of a BD sensor 200k are input to the integrated circuit (LSUASIC) of this laser scanning unit 220a.

The shading correction value signal (Vshade) output by the shading correction signal outputter 230 is calculated in an adjustment process of the optical scanning device 200 and stored in a ROM or the like of the storage 160. The shading correction values are sequentially read out from the storage 160 according to a position of the laser beam irradiating to the surface of the photoreceptor drum 130a in a main scanning direction.

As shown in FIG. 3B, the shading correction value signal (Vshade) passes through a path s1 via a resistor r1, and the offset value signal (Voffset) passes through a path s2 via a resistor r2, and both are superimposed at a connector c1 (superimposer (superimposing circuit) 280). As a result of being superimposed, the analog signal with the shading correction signal being offset (Vsw) can be input to the laser driver 210. There is provided a resistor r3 between the connector c1 and the ground (G). A power supply voltage Vcc is applied to an anode of the laser diode (laser light emitter 200a) and a cathode of a photodiode (PD).

The optical scanning device 200 has a light quantity detector 260 to detect a quantity of light emitted from the laser light emitter 200a, while the laser driver controller 250 controls the quantity of light emitted from the laser light emitter 200a detected by the light quantity detector 260 so as to be a target light quantity.

Specifically, the laser driver controller 250 employs an APC (Automatic Power Control) control method wherein the laser driver controller 250 monitors a light output (light power) of the laser diode by means of the light quantity detector 260 consisting of the photodiode (PD) built in the laser diode (laser light emitter 200a), for example, and controls a drive current of the laser diode in response to a reference voltage signal (Vref) so that the light output thereof becomes equal to the target light quantity.

In FIG. 3A, a signal XSH output from the control system of the optical scanner 220 is a signal for the APC. The APC is performed while the XSH signal is valid (i.e., Low). The image data is also output to the laser driver 210. Thereby, an electrostatic latent image corresponding to the image data is formed on the photoreceptor drum 130a.

The offset value determiner 240 determines an offset value (signal Voffset) based on a target light quantity signal (reference voltage signal (Vref) of the laser driver controller 250 during the APC control. The storage 160 stores an offset adjusting table 240a in which a relationship between the target light intensities and the offset values is preset. The offset value determiner 240 determines an offset value based on the target light quantity with reference to the stored offset adjusting table 240a.

As shown in FIG. 4, in an embodiment, an example of the offset adjusting table 240a is stored in a ROM (Read Only Memory) of the storage 160. The offset adjusting table 240a shown in FIG. 4 sets a relationship between target light quantity signals (reference voltage signal (Vref)) and offset value signals (signal Voffset).

By storing the offset adjusting table 240a in the storage 160 in advance, it is not necessary to recalculate the setting value of the analog signal to be input to the laser driver 210 according to changes in the target light quantity due to an environmental correction, an aging correction, or the like, to make the time required for a process shorter.

Furthermore, in order to address the issue of an offset value signal (signal Voffset) fluctuation depending on temperature, the storage 160 may store a plurality of offset adjusting tables 240a according to temperature as shown below in FIGS. 9A to 9C.

FIG. 5 shows a mechanical configuration of the optical scanner 220 of the optical scanning device 200.

As shown in FIG. 5, the optical scanner 220 scans the surface of the photoreceptor drum 130a with the laser beam to form the electrostatic latent image on the same.

As shown in FIG. 5, the optical scanning device 200 includes: the laser light emitter 200a to generate the laser beam (laser light); a collimator lens 200b to convert the incident laser beam into a parallel beam; an aperture 200c composed of a plate-shaped member which has an aperture 200c1 in a substantially center thereof; a concave lens 200e to expand the incident laser beam in combination with a fθ lens 200d which expands the laser beam in a scanning direction as described below; a cylindrical lens 200f; and an incident beam reflection mirror 200g, which are sequentially arranged in a laser beam projection direction of the laser beam emitted from the laser light emitter 200a.

In addition, there are arranged, in order in the reflection direction of the laser beam reflected with the incident beam reflection mirror 200g, the fθ lens 200d and a polygon mirror 200h having a plurality of reflecting surfaces on an outer periphery thereof, as well as in order in the reflection direction of the laser beam reflected with the reflection surface of the polygon mirror 200h, the fθ lens 200d, a reflection mirror 200i, an emitted beam reflection mirror 200j which makes a plane tilt correction of the polygon mirror 200h, and the photoreceptor drum 130a.

Finally, a beam detect sensor (BD sensor) 200k can detect the light reflected with the reflection mirror 200i. The BD sensor 200k is an optical sensor which can output a detection signal in accordance with the magnitude of the received light quantity of the laser beam. The BD sensor 200k has a function of detecting a reflected light of the laser beam on the scan starting side of the main scanning area (scanning area along an axial direction of the photoreceptor drum 130a), and controls the timing of writing the electrostatic latent image on the photoreceptor drum 130a.

The laser light emitter 200a also includes in the vicinity thereof the light quantity detector 260 equipped with a PD (photodiode) which detects the laser emission intensity.

1.4 Process Flow

Figure 6:
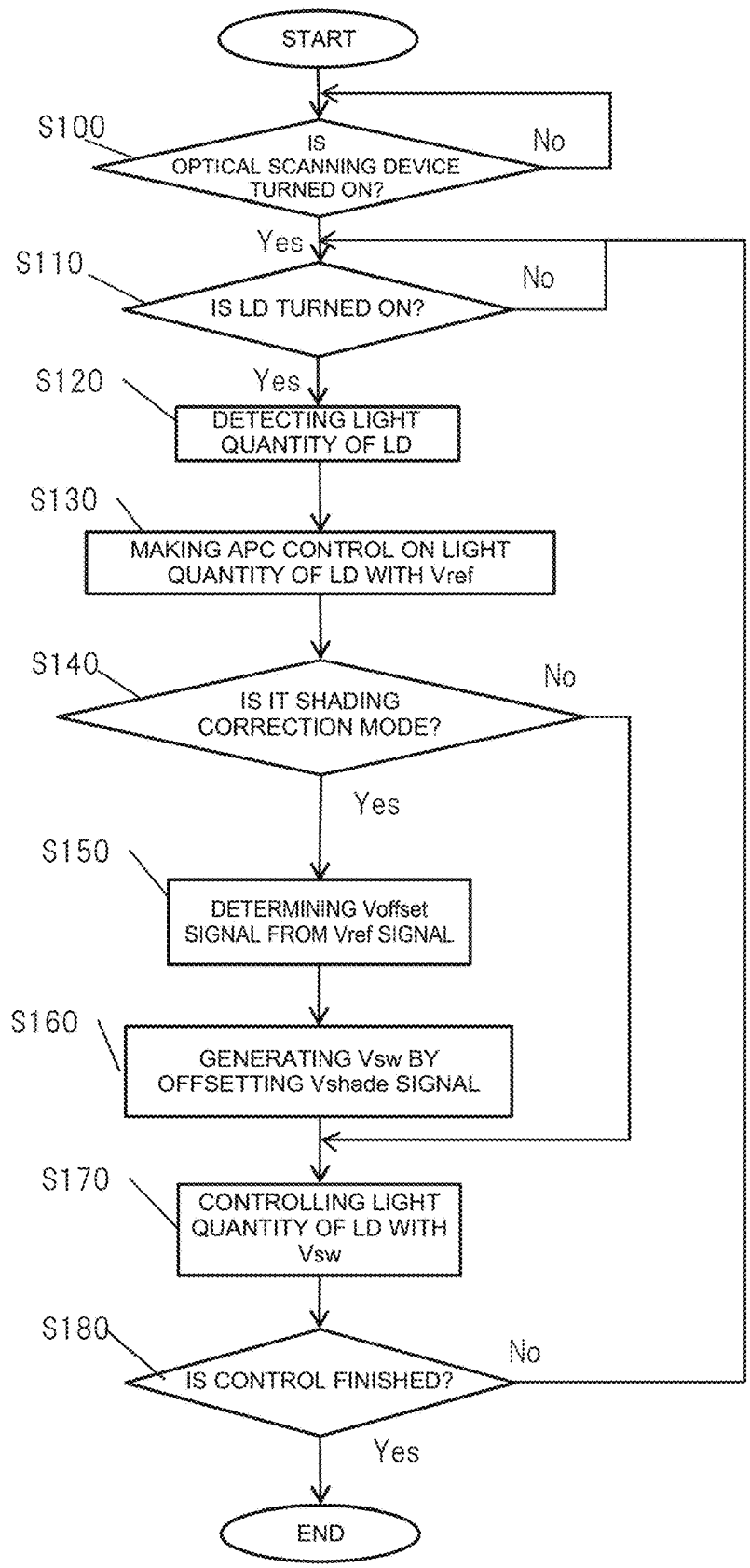
FIG. 6 is a flowchart illustrating a process flow of the optical scanning device.
Figure 7A:
FIGS. 7A, 7B, 7C, and 7D are an explanatory diagram of a detection signal of a BD sensor, an explanatory diagram of a signal of a shading correction value, an explanatory diagram of a signal of an offset value, and an explanatory diagram of a signal input to the laser driver, respectively.
Figure 7B:
Figure 7C:
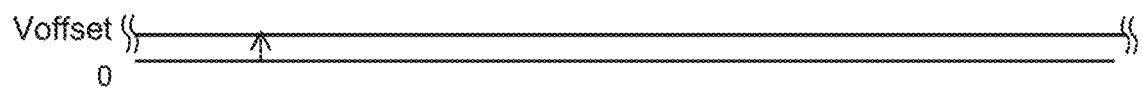
Figure 7D:

FIG. 6 is a flowchart illustrating a process flow of the optical scanning device, Hereinafter, each step number is denoted just as "S number". FIG. 4 shows a specific example of the offset adjusting table 240a. The controller 100 performs the process shown in FIG. 6 by reading the program stored in the storage 160.

The controller 100 determines whether the optical scanning device 200 is turned on (S100), and if it is turned on (S100: Yes), then the controller 100 determines whether the laser driver 210 is turned on (S110). If the laser driver 210 is turned on (S110: Yes), the controller 100 detects the quantity of light emitted from the laser light emitter 200a with the light quantity detector 260 (S120).

Next, the laser driver controller 250 controls the quantity of light emitted from the laser light emitter 200a detected by the light quantity detector 260 so as to meet the target light quantity (Vref signal) (i.e., APC control) (S130).

Next, the controller 100 determines whether it is a shading correction mode (S140). If it is the shading correction mode (S140: Yes), the controller 100 refers to the offset adjusting table 240a stored in the storage 160 to determine the offset value signal (Voffset) based on the target light quantity signal (Vref) (S150). Specifically, as shown in FIG. 4, the offset adjusting table 240a has an offset value signal (Voffset) from 192 to 32 (dec) corresponding to the target light quantity signal (Vref) from 0 to 255 (dec), and has a relationship that the offset value decreases as the target light quantity increases. If it is not the shading correction mode (S140: No), the processing by the controller 100 proceeds to S170.

Next, the controller 100 superimposes the shading correction value signal (Vshade) on the offset value signal of the analog signal (Voffset) to generate the analog signal with the shading correction signal being offset (Vsw) (S160).

Next, the controller 100 controls the quantity of light emitted from the laser light emitter (LD) 200a by inputting the analog signal (Vsw) to the laser driver (LD Driver) 210 (S170).

Next, the controller 100 determines whether control is finished (S180), and if the control is not finished (S180: No), returns to S110 and resumes the process. On the other hand, if the controller 100 determines that the control is finished (S180: Yes), the process shown in FIG. 6 ends.

1.5 Operation Example

FIGS. 7A to 7D show examples of the shading correction value signal (Vshade), the offset value signal (Voffset), and the offset shading correction signal (laser driver input signal: Vsw). Each of the abovementioned signals is an analog voltage signal. The BD signal is a detected signal from the laser beam on the start side of the main scanning area detected by the beam detect sensor (BD sensor) 200k.

As shown in FIGS. 7A to 7D, although the shading correction value signal (Vshade) has a portion close to a zero level, the offset shading correction signal (Vsw), which is obtained by superimposing it on the offset value signal (Voffset), is lifted to be away from the zero level. The analog shading correction signal with the signal having been offset (Vsw) is input to the laser driver 210.

1.6 Effects

According to the optical scanning device according to this embodiment, as a result of combining the offset value signal (Voffset) linked with a signal of the target light quantity (reference voltage signal (Vref)) of the laser driver controller 250 during APC control with the shading correction value signal (Vshade), the offset shading correction signal (Vsw) can be generated as well as the offset value can be adjusted.

Therefore, since the mere shading correction value is offset, it results in an effect that it is not necessary to recalculate and reset the shading correction value for all segments according to changes in the target light quantity due to the environmental correction the aging correction, or the like, to make a load of calculation and control smaller than the case where the recalculation and the like are done.

Furthermore, the resolution of shading is maintained even if the shading is performed at a low target light quantity.

Furthermore, since the offset values are stored as the offset adjusting table 240a in the storage 160 such as a ROM or the like, it is not necessary to recalculate the set value of the analog signal according to changes in the target light quantity due to the environmental correction, the aging correction, or the like, to make the time required for the process shorter. In addition, a load of the CPU can be reduced since it is no longer necessary for the CPU to perform the processing such as the recalculation.

Furthermore, since the offset values are stored individually associating with the target light quantity, the target light quantity does not deviate even if the P-I (laser emission quantity-operating current) characteristic of the laser light emitting device (laser light emitter 200a) or the original light quantity varies.

2. Second Embodiment

Figure 8:
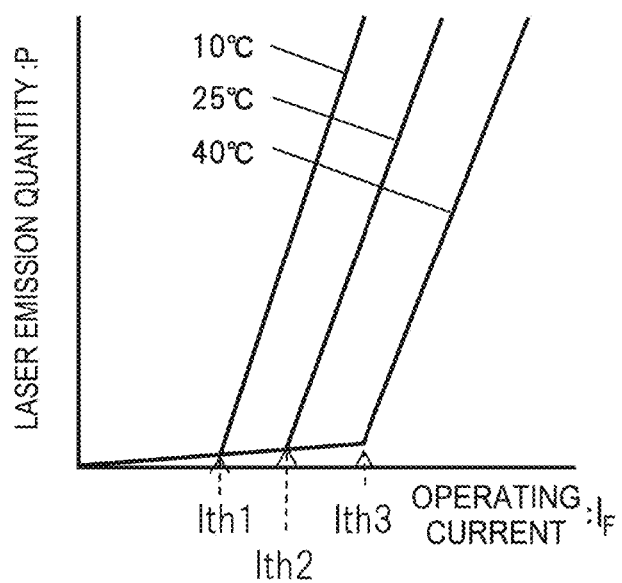
FIG. 8 is a diagram illustrating a light power-current characteristic of a laser light emitting device, which varies with temperature, to explain the optical scanning device according to a second embodiment.

The second embodiment relates to an offset adjusting table 240a of the optical scanning device 200, whose values are set for each temperature. FIG. 8 shows an example of P-I (laser emission quantity-operating current) characteristic of a laser light emitting device which varies depending on temperature, and FIGS. 9A to 9C show the exemplary offset adjusting tables for each temperature.

As shown in FIG. 8, the laser light emitting device is driven to emit light upon the operating current $I_F$ exceeds the oscillation start current (i.e., threshold) Ith. The oscillation start current Ith (Ith1, Ith2, Ith3 . . . ), the operating current $I_F$, and the laser emission quantity P vary depending on the temperature of the laser emitting device.

Referring to FIG. 8, when the temperature is 10° C., the laser emission quantity P is large even the oscillation start current Ith1 and the operating current $I_F$ are small. However, as shown in FIG. 8, when the temperature rises from 25° C. (oscillation start current Ith2) to 40° C. (oscillation start current Ith3), not only the oscillation start current Ith but also the operating current $I_F$ to output certain laser emission quantity P are larger than those at 10° C.

In the second embodiment, as shown in FIGS. 9A to 9C, the offset adjusting tables for some temperature ranges are stored in the ROM of the storage 160, and a suitable offset adjusting table is selected according to temperature. FIGS. 9A, 9B, and 9C show the offset adjusting table for the temperature range between 5 and 15° C., the offset adjusting table for the temperature range between 15 and 30° C., and the offset adjusting table for the temperature range between 30 and 45° C., respectively.

As can be seen by comparing the respective offset adjusting tables shown in FIGS. 9A, 9B, and 9C, the offset value signal (Voffset) corresponding to the target light quantity signal (Vref) becomes larger as the temperature increases. As a result, the shading correction values are offset so that they increase as the temperature rises. In other words, since as the temperature rises the light quantity of the laser light emitting device decreases at the same drive current, it is attempted to increase the drive current by increasing the offset value in order to bring the light quantity closer to the target light quantity.

According to the second embodiment, as shown in FIGS. 9A to 9C as an example, it results in a remarkable effect that since the offset values are stored for each temperature range, the target light quantity does not deviate even if the P-I (light power-operating current) characteristic of the laser light emitting device (laser light emitter 200a) varies.

In the second embodiment, although the offset values are stored for each temperature range, the present disclosure is not limited thereto, and offset values according to any events other than temperature may be stored in the storage.

In an example where the offset values are stored individually for each light power-operating current characteristic (P-I characteristic) of the laser light emitter or for each original light quantity characteristic of the laser light emitter, it is possible to select an optimum offset value according to these characteristics of the individual laser emitting device and to input an analog signal to achieve the target light quantity to the laser driver.

Conventionally, there were problems in the method of calculating the voltage setting value of the analog signal according to the target light quantity and bringing it close to the target light quantity. The problems are, for example, that it is necessary to recalculate the target light quantity according to changes in the target light quantity due to the environmental correction, the aging correction, or the like, the resolution of shading becomes poor when the shading is performed at a low target light quantity, and the target light quantity deviates when the P-I characteristics or the original light intensities of the laser emitting devices vary individually. According to the present disclosure, these problems can be solved by simply offsetting the analog input signal using the offset value stored in the storage without performing any recalculations.

The signal to be offset by the offset value, which is not limited to the shading correction signal, may be any analog signal input to the laser driver such as the target light quantity signal (Vref), the image input signal, and the like. As the analog signal can be offset according to the target light quantity, this allows the optical scanning device using the laser driver in which the excess of a current over the bias current is increased or decreased in proportion to the analog signal to bring the laser light output intensity close to the target light quantity.

3. Third Embodiment

Figure 10:
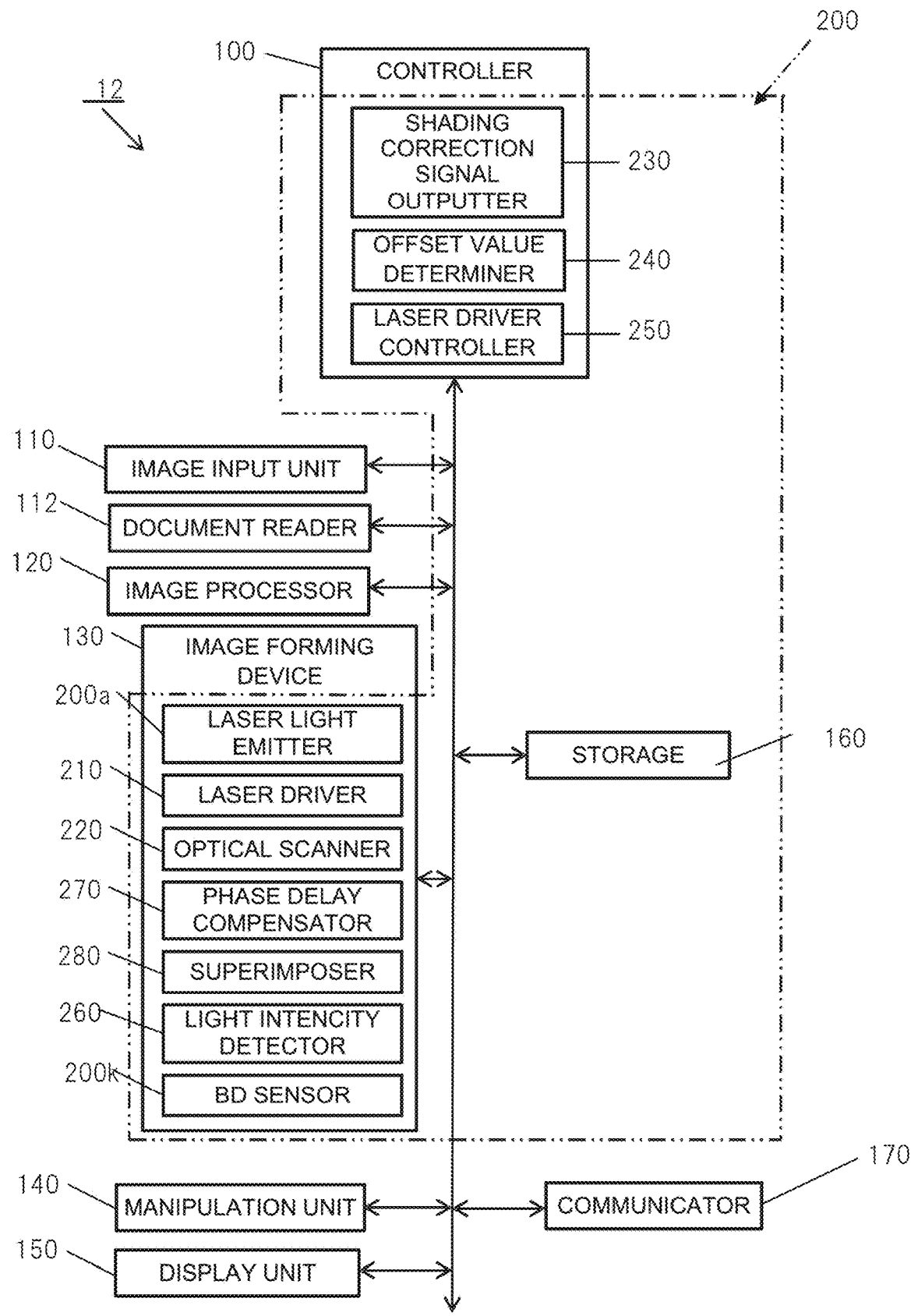
FIG. 10 is a control block diagram of an image-forming apparatus and an optical scanning device according to a third embodiment.

In the third embodiment, the quantity of light emitted from the laser light emitter is controlled by inputting to the laser driver a signal in which a phase-delay-compensated offset value signal is superimposed on the shading correction value signal. FIG. 10 shows this embodiment, which is replaced with FIG. 2 showing the first embodiment. The same functional part and processing are denoted by the identical numerical number and the explanations thereof are omitted.

3.1 Functional Configuration

With reference to FIG. 10, a functional configuration of the image-forming apparatus 12 of the present embodiment is described. The image-forming apparatus 12 is different from the image-forming apparatus 10 in that the image forming unit 130 further includes a phase delay compensator 270. The image-forming apparatus 12 also includes the BD sensor 200k in the image forming unit 130.

3.2 Optical Scanning Device 200

As shown in FIG. 10, the optical scanning device 200 is mounted on the image-forming apparatus 12. The mechanical configuration of the optical scanner 220 of the optical scanning device 200 is the same as that of the first embodiment shown in FIG. 5.

In this embodiment, the optical scanner 220 includes: the laser light emitter 200a to generate the laser beam (laser light); the collimator lens 200b to convert the incident laser beam into a parallel beam; the aperture 200c composed of a plate-shaped member which has the aperture 200c1 in a substantially center thereof; the concave lens 200e to expand the incident laser beam in combination with the fθ lens 200d which expands the laser beam in a scanning direction as described below; the cylindrical lens 200f; and the incident beam reflection mirror 200g, which are sequentially arranged in the laser beam projection direction of the laser beam emitted from the laser light emitter 200a.

Figure 11:
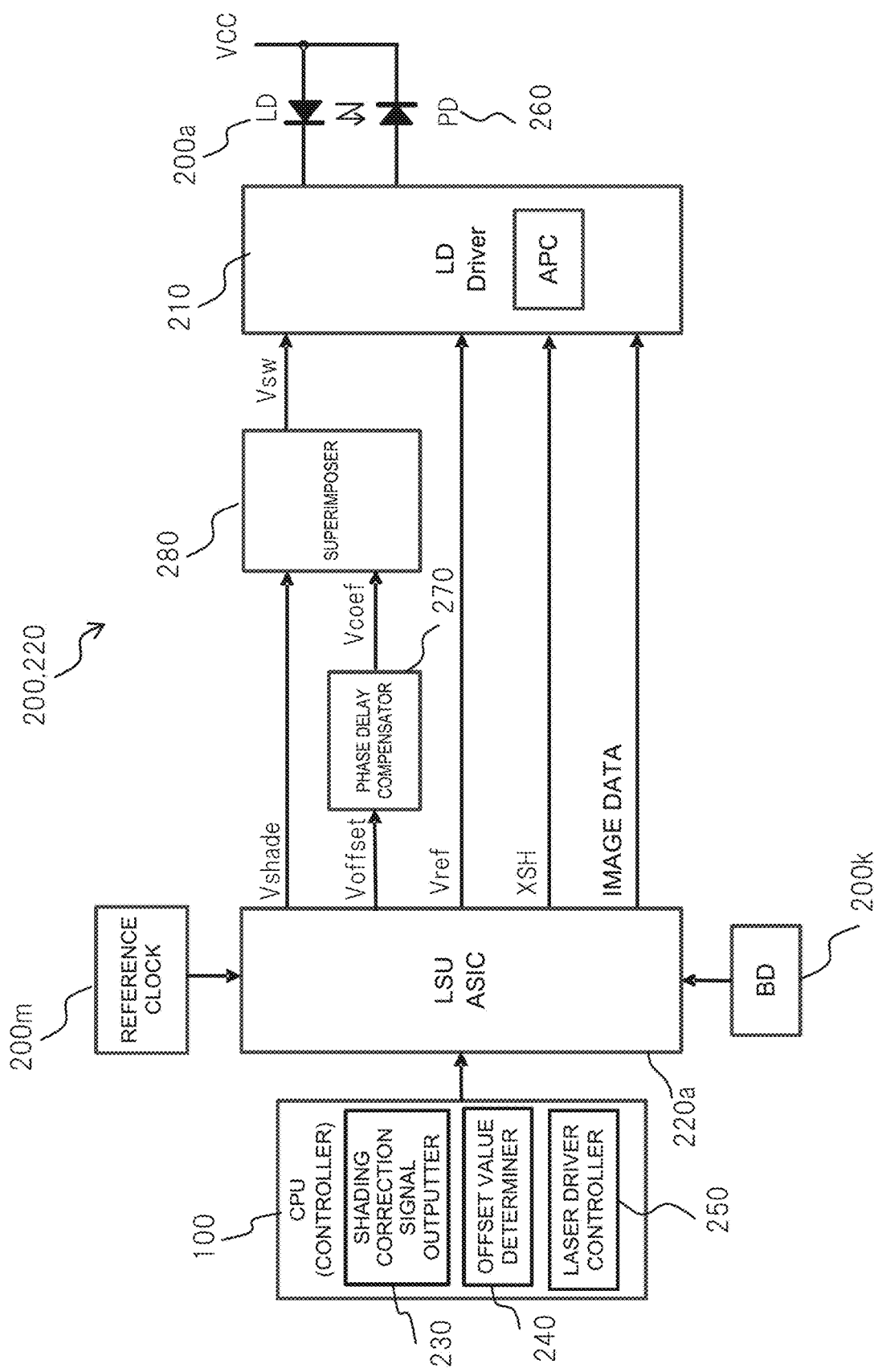
FIG. 11 is a control block diagram illustrating the control system of the laser driver in the optical scanning device.
Figure 12:
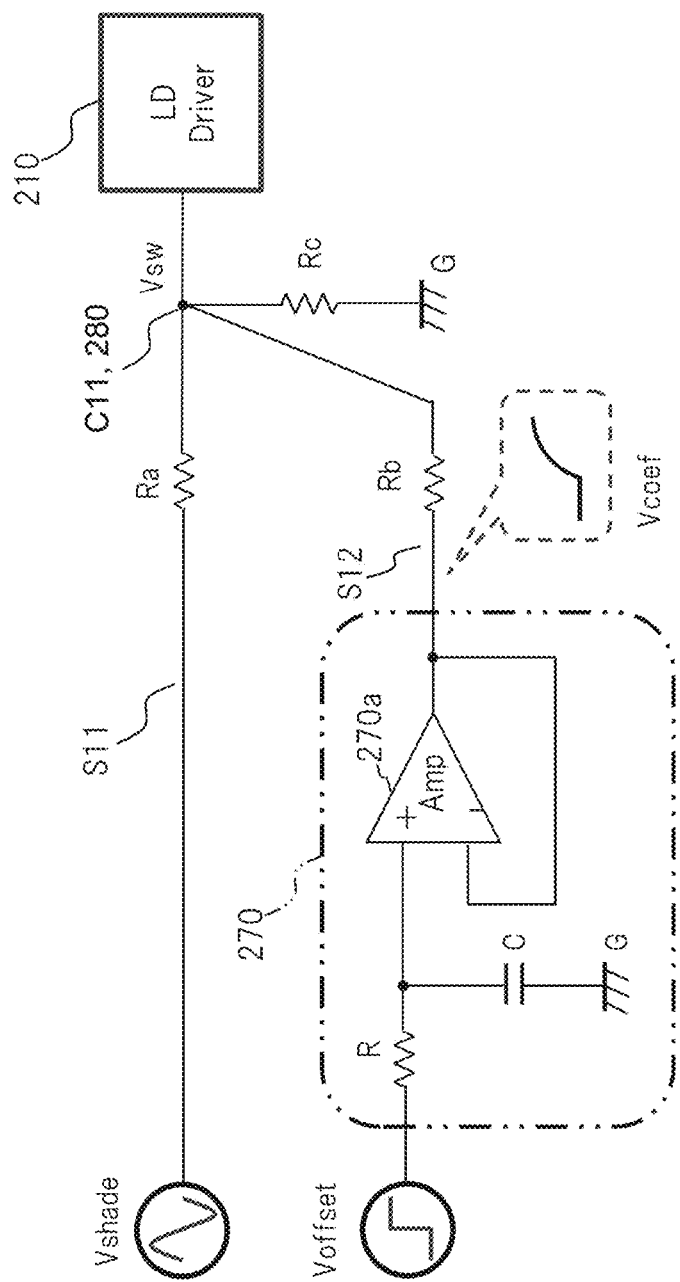
FIG. 12 is an explanatory diagram illustrating a specific circuit configuration composed of a phase delay compensator and a superimposer.

FIG. 11 shows a block diagram of the control system of the laser driver in the optical scanning device 200, and FIG. 12 shows an explanatory diagram illustrating a specific circuit configuration of a phase delay compensation circuit.

As shown in FIGS. 10 and 11, the optical scanning device 200 includes: the laser light emitter (LD: Laser Device) 200a in which the excess of a current over the bias current is increased or decreased in proportion to the input analog signal; the laser driver (LD driver) 210 to drive the laser light emitter; the optical scanner 220 to scan the photoreceptor drum 130a being an object with a laser beam (laser light) output from the laser light emitter 200a; the shading correction signal outputter 230 to output the shading correction value signal (Vshade) for making a shading correction on a light scanning the object; the offset value determiner 240 to determine an offset value of the analog signal input to the laser light emitter 200a based on a target light quantity (Vref) of the laser light emitter 200a; a phase delay compensator 270 to compensate for a phase delay of the determined offset value signal (Voffset); the superimposer (superimposing circuit) 280 to superimpose the phase-delay-compensated offset value signal (Vcoef) on the analog signal (shading correction value signal (Vshade)) and offset it; and the laser driver controller 250 to control the quantity of light emitted from the laser light emitter 200a by inputting a signal superimposed at the superimposer 280 (Vsw) to the laser driver 210.

In the optical scanning device 200, the control system of the optical scanner 220 has the laser scanning unit 220a shown in FIG. 11. The laser scanning unit 220a inputs signals output from the shading correction signal outputter 230 and the offset value determiner 240 to the laser driver 210 in response to a control signal from the controller 100. The laser scanning unit 220a is composed of an application-specific integrated circuit (LSUASIC), for example. A reference clock signal 200m and a detection signal of a BD sensor 200k are input to the integrated circuit (LSUASIC) of this laser scanning unit 220a.

The shading correction value signal (Vshade) output by the shading correction signal outputter 230 is obtained in advance by experiments or the like, and stored in the ROM or the like of the storage 160. The shading correction value signal (Vshade) is an analog voltage signal. The laser driver 210 controls in response to an input of the shading correction value signal the excess of a current over the bias current of the laser light emitter 200a so as to be proportional to the input signal. The offset values are sequentially read from the storage 160 according to the irradiation position of the laser beam with respect to the surface of the photoreceptor drum 130a in the main scanning direction based on the detection signal of the BD sensor 200k.

The offset value signal (Voffset) output by the offset value determiner 240 is an analog voltage signal. The signal is a voltage signal for a shading ratio correction and corresponds to the deference between the bias current and the threshold of the laser light emitter 200a.

The phase delay compensator 270 outputs a voltage signal (Vcoef) in which the phase delay of the offset value signal (Voffset) is compensated.

In the APC described below, the laser driver controller 250 and the laser scanning unit 220a control the quantity of light emitted from the laser light emitter 200a so as to be the target light quantity based on the quantity of light emitted from the laser light emitter 200a detected by the light quantity detector 260 consisting of a PD (photodiode) provided in the vicinity of the laser light emitter 200a.

Specifically, the target light quantity signal is controlled according to the reference voltage (Vref) in a sub scanning direction. This reference voltage signal (Vref) is input to the laser driver 210 to become the reference voltage of the APC described below. The laser driver 210 controls the current of the laser light emitter 200a so that the light quantity is proportional to the reference voltage signal (Vref).

The light quantity detector 260 has a photodiode (PD) built in the laser diode (laser light emitter 200a), for example. The laser driver controller 250 employs the APC (Automatic Power Control) control method wherein the laser driver controller 250 monitors a light output (light power) of the laser light emitter 200a detected by means of the light quantity detector 260, and controls a drive current of the laser light emitter 200a automatically so that the light output thereof becomes equal to the target light quantity which is a constant value according to a level of the reference voltage signal (Vref).

In general, the APC has an initial APC and a stationary APC. The initial APC indicates a lighting mode which is performed when initializing the laser light emitting device, and is referred to as initialization or $1^{st}$ APC. The stationary APC indicates an APC performed for each line scan, and is referred to as line APC or APC simply.

In FIG. 11, the signal XSH output from the control system of the optical scanner 220 is a signal for the APC. The APC is performed while the XSH signal is valid (i.e., Low). The image data is also output to the laser driver 210. Thereby, an electrostatic latent image corresponding to the image data is formed on the photoreceptor drum 130a.

The detection signal of the BD sensor 200k is used in such a way that monitoring and synchronous detection at the stationary APC are generally performed at the same time.

FIG. 12 shows a specific circuit configuration composed of the phase delay compensator 270 and the superimposer 280. As shown in FIG. 12, the shading correction value signal (Vshade) passes through a path s11 via a resistor Ra, while the offset value signal (Voffset) passes through a path s12 via the phase delay compensator (phase delay compensation circuit) 270, and the shading correction value signal (Vshade) is superimposed on the offset value signal (Voffset) at a connector c11 (superimposer (superimposing circuit) 280). As a result of superimposing, an analog signal with the shading correction signal being offset by a phase-compensated offset signal (Vsw) is input to the laser driver 210. There is provided a resistor Rc between the connector c11 and the ground (G). A power supply voltage Vcc is applied to an anode of the laser diode (laser light emitter 200a) and a cathode of a photodiode (PD).

In the specific circuit of the phase delay compensator 270, a voltage follower circuit, in which an output voltage Vout is input to the inverting input (−) side of an operational amplifier (Amp) 270a, is configured. The offset value signal (Voffset) is input to the non-inverting input (+) side of the operational amplifier (Amp) 270a via a resistor R and a capacitor C.

The output signal of the operational amplifier (Amp) 270a becomes the phase-delay-compensated offset value signal (Vcoef), and then is transmitted via the resistor Rb to the connector c11.

The phase delay compensator 270 includes a CR circuit consisting of the resistor R and the capacitor C, and the phase delay of the offset value signal (Voffset) is compensated according to a time constant τ of the CR circuit.

The time constant τ is as follows.

First, the following formula (1) is established for the voltage Vc(t) of the capacitor C in the CR circuit.

$$Vc(t) = E(1 - \exp\{(-1/CR)t\}) \quad \text{formula (1)}$$

where E is a voltage value (a voltage magnitude of the offset value signal (Voffset)), exp{x} is an exponential function representing a natural logarithm of e raised to the power of x, t is a time, and CR is a time constant τ.

Since the voltage of this capacitor becomes the input voltage of the non-inverting input (+), the delay compensation set by the time constant can be performed.

In the circuit shown in FIG. 12, since the phase delay compensator 270 is added to the circuit for offsetting (signal Voffset) according to the target light quantity (reference voltage Vref), when the variation amount of the offset value is large, the variation amount per a line becomes small and the stationary APC allows the light quantity to be returned to the target light quantity.

3.3 Operation Example

Figure 13A:
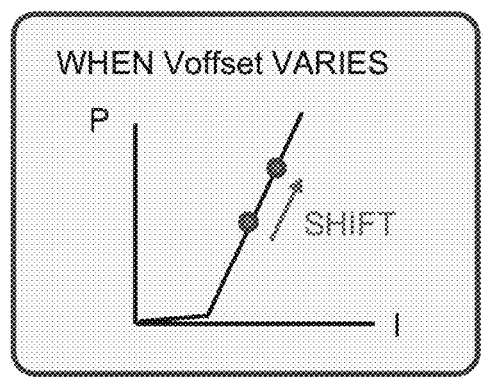
FIGS. 13A and 13B are operation images of the drive current and the output light quantity of the laser device when a fluctuation is in the signal of the offset value Voffset, and when a stationary APC is applied, respectively.
Figure 13A:
Figure 13B:
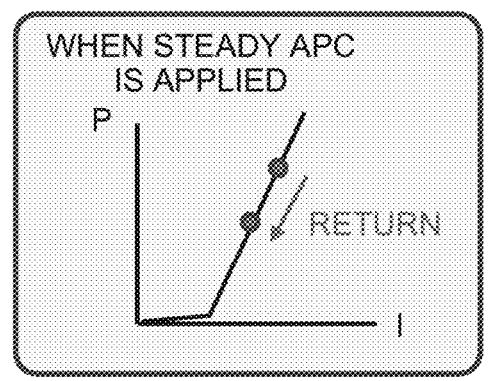

The operation images of the drive current I and the output light quantity P of the laser device are shown in FIGS. 13A and 13B. If the offset value signal Voffset varies (varying upwardly in FIG. 13A), the variation can be compensated by applying the stationary APC (returning downwardly in FIG. 13B).

It is necessary to set the time constant τ of the phase delay compensator 270 to a suitable range.

Therefore, it is preferable for the phase delay compensator 270 to set a lower limit value of the time constant t to a range in which the light quantity changing per line scanning time is balanced with the light quantity returned by applying the stationary light quantity control.

It is also preferable for the phase delay compensator 270 to set an upper limit value of the time constant t so as to be smaller than a change cycle of a sub-scan shading.

If the time constant τ is set to be larger than the change cycle of the sub-scan shading, it does not allow the light quantity to follow the target light quantity even if performing the sub-scan shading. Therefore, it is preferable to set the upper limit of the time constant τ to be smaller than the change cycle of the sub-scan shading.

In addition, in FIG. 12, the analog signal (Vsw) offset by the offset value signal (Voffset) is obtained by superimposing the offset value signal (Voffset) on the shading correction value signal (Vshade), as the following formula (2).

$$Vsw = (Vshade \times RbRc + Voffset \times RcRa)/(RaRb + RbRc + RcRa) \quad \text{formula (2)}$$

FIGS. 14A to 14H are diagrams explaining a relationship among signals of each part in the optical scanning device 200 shown in FIG. 11. Specifically, FIGS. 14A, 14B, 14C, 14D, 14E, 14F, 14G, and 14H illustrate the BD signal, the shading correction value signal (Vshade), the offset value signal (Voffset), the phase-delay-compensated offset value signal (Vcoef), the offset analog signal (Vsw), the signal for the APC (XSH), the signal of the image data, and the signal of the light output, respectively.

Figure 14A:
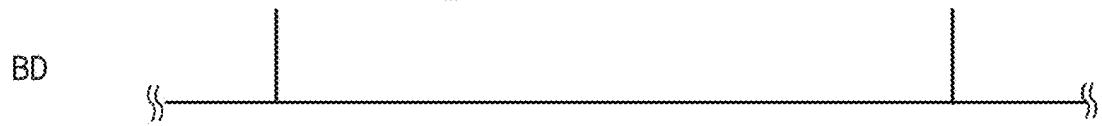
FIGS. 14A, 14B, 14C, 14D, 14E, 14F, 14G, and 14H are an explanatory diagram of a BD signal, an explanatory diagram of a signal of a shading correction value (Vshade), an explanatory diagram of a signal of an offset value (Voffset), an explanatory diagram of a signal of a phase-delay-compensated offset value (Vcoef), an explanatory diagram of an analog signal in an offset state (Vsw), an explanatory diagram of a signal for an APC (XSH), an explanatory diagram of a signal of an image data, and an explanatory diagram of a signal of a light output, respectively, to explain a relationship among the signals of each part in the optical scanning device.
Figure 14B:
Figure 14C:
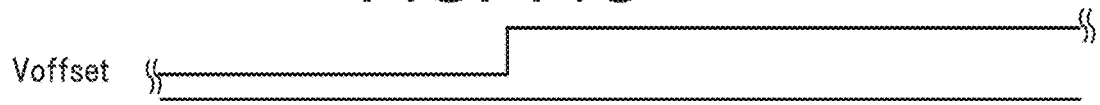
Figure 14D:
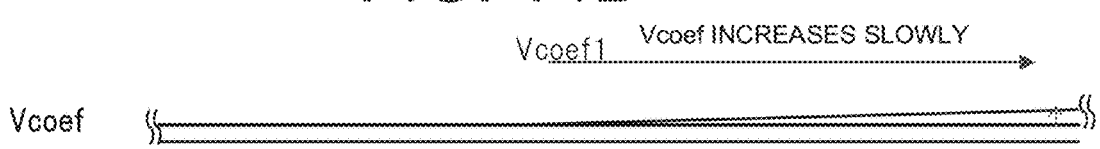
Figure 14E:
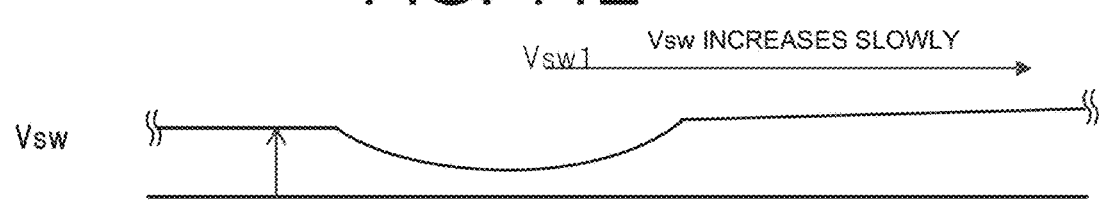
Figure 14F:
Figure 14G:

Even when the offset value signal (Voffset) rises steeply in a step-like shape as shown in FIG. 14C, the phase-delay-compensated offset value signal (Vcoef) rises slowly as depicted by the arrow (Vcoef1) shown in FIG. 14D. Accordingly, the superimposed analog signal (Vsw) also rises gradually, as depicted by the arrow (Vsw1) shown in FIG. 14E.

Figure 14H:

Therefore, as shown in FIG. 14H, the light output rises slowly when the offset value signal rises. It allows the light output after being offset according to the image data to rise up to only 101% compared with the light output before being offset, for example. Since the APC emission also can rise up to only 101% at the event of the rise, for example, it can be seen that the APC can immediately return the light output down to 100%.

3.4 Comparative Example

A comparative example is described below. The comparative example is the optical scanning device in which the phase delay compensator (phase delay compensation circuit) is excluded from the optical scanning device of the first embodiment as shown in FIGS. 3A and 3B.

In the optical scanning device of the comparative example, because of excluding the phase delay compensator (phase delay compensation circuit) of the first embodiment, the offset value signal (Vsw) in which the offset value signal (Voffset) is directly superimposed on the shading correction value signal (Vshade) is input to the laser driver 210. Therefore, as shown in FIGS. 15A to 15G, the output of the laser light emitter 200a fluctuates greatly due to the variation of the offset value signal (Voffset).

Figure 15A:
FIGS. 15A, 15B, 15C, 15D, 15E, 15F, and 15G are an explanatory diagram of the BD signal, an explanatory diagram of the signal of the shading correction value (Vshade), an explanatory diagram of the signal of the offset value (Voffset), an explanatory diagram of the analog signal in the offset state (Vsw), an explanatory diagram of the signal for the APC (XSH), an explanatory diagram of the signal of the image data, and an explanatory diagram of the signal of the light output, respectively, to explain a relationship among the signals of each part in the optical scanning device according to a comparative example.
Figure 15B:
Figure 15C:
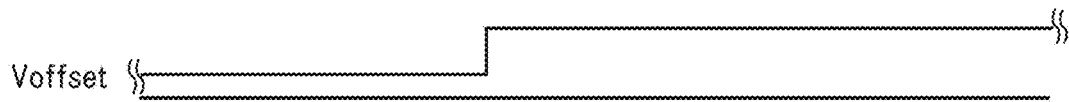
Figure 15D:
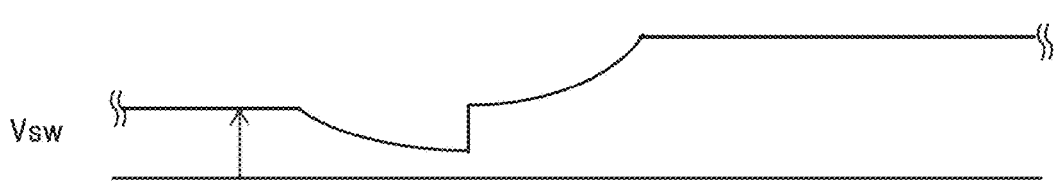
Figure 15E:
Figure 15F:

Specifically, when the offset value signal (Voffset) rises steeply in a step-like shape as shown in FIG. 15C, the analog signal (Vsw) to be input to the laser driver also rises steeply according to the offset value signal (Voffset) as shown in FIG. 15D. Accordingly, as shown in FIG. 15G, excessive light emission areas (hatched areas in the drawing) are generated.

Figure 15G:
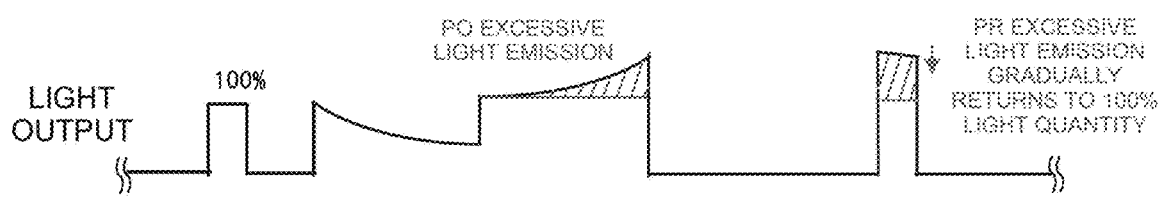

Therefore, as shown in FIG. 15G, the optical output of the laser light emitter rises steeply according to the superimposed analog signal (Vsw). As a result, the excessive light emission area (hatched portion Po) is generated in the optical output associated with the image data, and the excessive light emission area (hatched portion Pr) is also generated in the APC light emission. Although the light quantity of the excessive light emission area gradually returns down to 100% light quantity, the following problems occur.

In a configuration of the comparative example having no phase delay compensator, in which the offset value is applied according to the target light quantity, when any changes cause in the offset value, the following events may occur as the operating point of the laser changes.

In an event where the offset value varies greatly, a light quantity different from the target light quantity is output, resulting in an incorrect density during image formation.

Furthermore, in the event where the offset value varies greatly, the laser emitting device may provide the excessive light emission, resulting in failure.

Furthermore, in an event where the variation amount of the offset value is large, the light quantity does not reach the target light quantity unless performing the APC for a long period of time to some extent.

The offset value may change greatly while the sub-scan shading is performed or when an error happens in a thermistor.

3.5 Effect of Embodiments

In the optical scanning device 200 of the embodiment, since a phase delay compensator is provided, it results in a remarkable effect that any events which may cause in the comparative example do not occur.

Namely, even if the offset value varies greatly, a light quantity different from the target light quantity is not output.

Furthermore, even if the offset value varies greatly, the laser emitting device does not provide the excessive light emission.

Furthermore, the laser emitting device does not fail in the following events where the offset value is changed significantly. For example, it does not fail in an event where the sub-scan shading is performed, an error happens in the thermistor, a noise printing is performed, or a software is erroneously set.

Furthermore, in an event where the variation amount in the offset value is large, the light quantity can be returned to the target light quantity with the stationary APC.

Furthermore, the variation amount per a time period of a line scanning can be reduced.

Furthermore, even if performing the sub-scan shading, it is possible to cause the light quantity to follow the target light quantity.

Thus, according to the embodiments, it results in remarkable effects that a long time is not required for the process according to changes in the target light quantity, the resolution is maintained while the shading processing is performed, any deviation in the target light quantity can be prevented, etc.

Although the embodiments have been described above, it should be understood that the specific configurations are not limited to the embodiments, and design variation or the like within a range not departing from the gist of the invention are also included in the scope of the claims.

Furthermore, in the embodiments, the program which can operate in each device is a program that controls a CPU or the like so as to realize the functions of the embodiments described above (a program that causes a computer to function). The information handled by these devices is temporarily stored in a transitory storage device (e.g., RAM) during the processing, then stored in various ROM or HDD storage devices, and read, modified and written by the CPU as necessary.

Here, the recording medium for storing the program may be a non-transitory recording medium such as a semiconductor medium (e.g., a ROM, a non-volatile memory card, etc.), an optical recording medium/magnetooptical recording medium (e.g., DVD (Digital Versatile Disc), MO (Magneto Optical Disc), (MD (Mini Disc), CD (Compact Disc), BD (Blue-ray Disc), etc.), magnetic recording media (e.g., magnetic tape, flexible disk, etc.), or the like.

Not only are the functions of the above-described embodiments realized by executing the loaded program, but also the functions of the present disclosure may be realized by processing the program based on the instructions of the program along with an operating system, another application program, and the like.

When the program is distributed in the market, it can be distributed by storing the program in a portable storage device or transferred to a server computer connected via a network such as the Internet. In this case, the storage device of the server computer is of course covered by the present invention.

In addition, part or all of the devices in the above-described embodiments may be realized as an LSI (Large Scale Integration), which is typically an integrated circuit. Each functional block of each device may be individually integrated into each chip, or may be partially or fully integrated into a chip. The integrated circuit method is not limited to LSI, but can be realized by dedicated circuits or general-purpose processors. In addition, when the progress of the semiconductor technology can replace LSI with a new technology of integrated circuits, it is of course possible to use such a new technology for the present invention.

What is claimed is:

1. An optical scanning device comprising:
   a laser light emitter in which an excess of a current over a bias current is increased or decreased in proportion to an analog signal input thereto;
   a laser driver to drive the laser light emitter;
   an optical scanner to scan a surface of an object with laser light emitted from the laser light emitter;
   a light quantity detector to detect a quantity of light of the laser light;
   a laser driver controller to perform a stationary light quantity control in which the quantity of light emitted from the laser light emitter detected by the light quantity detector is controlled to be a target light quantity every time the optical scanner performs a line scanning;
   a storage to store an offset adjusting table in which the target light quantity is associated with an offset value of the analog signal input to the laser light emitter; and
   an offset value determiner to determine the offset value associated with the target light quantity by using the offset adjusting table, wherein
   the laser driver controller controls the quantity of light emitted from the laser light emitter by inputting, to the laser driver, a signal generated by superimposing the determined offset value on the analog signal.

2. The optical scanning device according to claim 1, further comprising a shading correction signal outputter to output a shading correction signal to perform a shading correction on the laser light that the surface of the object is scanned with, wherein the analog signal includes the shading correction signal.

3. The optical scanning device according to claim 1, wherein the offset adjusting table stores the offset value independently for each light quantity-current characteristic or for each original light quantity characteristic of the laser light emitter.

4. The optical scanning device according to claim 1, wherein the offset value varies according to temperature.

5. The optical scanning device according to claim 1, wherein the storage stores a plurality of offset adjusting tables, including the offset adjusting table, according to temperature.

6. The optical scanning device according to claim 1, further comprising:
   a shading correction signal outputter to output a shading correction signal to perform a shading correction on the laser light that the surface of the object is scanned with;
   a phase delay compensator to compensate for a phase delay of the signal of the determined offset value; and
   a superimposer to superimpose a signal of the phase-delay-compensated offset value on a signal of a shading correction value,
   wherein the laser driver controller controls the quantity of light emitted from the laser light emitter by inputting the signal superimposed by the superimposer to the laser driver.

7. The optical scanning device according to claim 6, wherein the phase delay compensator sets a lower limit of a time constant within a range in which the light quantity changed per a time period of the line scanning is balanced with the light quantity returned by the stationary light quantity control.

8. The optical scanning device according to claim 6, wherein
   the shading correction signal outputter outputs the shading correction signal in a sub-scanning direction, and
   the phase delay compensator sets an upper limit of a time constant so as to be smaller than a change cycle of a sub-scan shading.

9. An image-forming apparatus comprising:
   a laser light emitter in which an excess of a current over a bias current is increased or decreased in proportion to an analog signal input thereto;
   a laser driver to drive the laser light emitter;
   an optical scanner to scan a surface of an object with laser light emitted from the laser light emitter;
   a light quantity detector to detect a quantity of light of the laser light;
   a laser driver controller to perform a stationary light quantity control in which the quantity of light emitted from the laser light emitter detected by the light quantity detector is controlled to be a target light quantity every time the optical scanner performs a line scanning;
   a storage to store an offset adjusting table in which the target light quantity is associated with an offset value of the analog signal input to the laser light emitter;
   an offset value determiner to determine the offset value associated with the target light quantity by using the offset adjusting table;
   an image carrier, on a surface of which an electrostatic latent image is formed by scanning the surface with the laser light emitted from the laser light emitter, using the optical scanner; and
   a developer to develop the electrostatic latent image formed on the surface of the image carrier, wherein
   the laser driver controller controls the quantity of light emitted from the laser light emitter by inputting, to the laser driver, a signal generated by superimposing the determined offset value on the analog signal.

10. A method of controlling an optical scanning device including a laser light emitter in which an excess of a current over a bias current is increased or decreased in proportion to an analog signal input thereto, a laser driver to drive the laser light emitter, an optical scanner to scan a surface of an object with laser light emitted from the laser light emitter a light quantity detector to detect a quantity of light of the laser light, and a storage to store an offset adjusting table in which the target light quantity is associated with an offset value of the analog signal input to the laser light emitter, the method comprising:
   performing a stationary light quantity control in which the quantity of light emitted from the laser light emitter detected by the light quantity detector is controlled to be a target light quantity every time the optical scanner performs a line scanning;
   determining an offset value associated with the target light quantity by using the offset adjusting table; and
   controlling the quantity of light emitted from the laser light emitter by inputting, to the laser driver, a signal generated by superimposing the determined offset value on the analog signal.

* * * * *